US006455822B1

(12) United States Patent
Chang

(10) Patent No.: US 6,455,822 B1
(45) Date of Patent: Sep. 24, 2002

(54) HEAT SINK FOR A PTC HEATING ELEMENT AND A PTC HEATING MEMBER MADE THEREOF

(75) Inventor: Kee Hung Daniel Chang, Hong Kong (HK)

(73) Assignee: Mega Dynamics Ltd. (HK)

( * ) Notice: Subject to any disclaimer, the term of this patent is extended or adjusted under 35 U.S.C. 154(b) by 0 days.

(21) Appl. No.: 09/685,767

(22) Filed: Oct. 11, 2000

(51) Int. Cl.[7] .............................. H05B 3/06; F28F 7/00; H01L 7/10

(52) U.S. Cl. ...................... 219/540; 165/185; 338/22 R

(58) Field of Search ................................ 219/534, 538, 219/540, 541, 544, 505; 338/22 R, 23; 165/80.2, 185

(56) References Cited

U.S. PATENT DOCUMENTS 4,037,082 A * 7/1977 Tamada et al. ............. 219/541
4,327,282 A * 4/1982 Nauerth ....................... 219/541
4,822,980 A * 4/1989 Carbone et al. ............ 392/453
4,954,692 A * 9/1990 Shikama et al. ............ 219/540
5,896,264 A * 4/1999 Bijlenga et al. .......... 338/22 R

FOREIGN PATENT DOCUMENTS

DE 4010620 * 10/1991
EP 573691 * 12/1993

* cited by examiner

*Primary Examiner*—Sang Paik
(74) *Attorney, Agent, or Firm*—Burns, Doane, Swecker & Mathis, L.L.P.

(57) ABSTRACT

There is disclosed a heat sink for a PTC heating element, which heat sink including a first end, a second end, and a pair of webs extending from the second end towards the first end, in which each of the webs is connected to the cover face via a respective curved section, and the curved section is inward of the respective web.

24 Claims, 13 Drawing Sheets

HEAT SINK FOR A PTC HEATING ELEMENT AND A PTC HEATING MEMBER MADE THEREOF

FIELD OF THE INVENTION

This invention relates to a heat sink for a Positive Temperature Coefficient (PTC) heating element and a PTC heating member including such a heat sink. This invention also relates to a method for forming such a PTC heating member, and a method of securing such a PTC heating member to an electric appliance.

BACKGROUND OF THE INVENTION

PTC heating members are now used in a large variety of electrical appliances, e.g. electric hair styling apparatus, hair straightening apparatus, and facial steamers. Such PTC heating members are provided with a heat sink usually made of a hollow body extruded section composed of a metal, e.g. aluminium. The hollow body extruded section includes two oppositely-facing and generally parallel inner surfaces which are brought into contact with a PTC heating element which includes a PTC pellet or stone, upon deformation of the extruded section. The PTC pellet is electrically linked with an electricity supply, e.g. via two electric wires. The PTC pellet will generate heat upon passing of electricity. The heat so generated by the PTC pellet is transferred to the heat sink for appropriate use, e.g. for onward transfer to a heating surface of an electrical appliance.

European Patent Document No. EP 0 573 691 A discloses a method of producing a PTC heating element. The teaching of this prior art document is incorporated by reference herein. According to this method, the extruded section has a base face on which two webs are provided. Before pressing, the webs stand approximately perpendicular to the plane of the base face, and the webs are connected to a cover face via sections which are curved outward in an approximately U-shaped to semi-circular manner. The extruded section is deformed in such a manner that the radius of curvature of the curved sections is reduced, that the webs are inclined outward relative to the perpendicular by an angle, and that the cover face is brought into contact with the PTC element.

One drawback associated with such prior art heat sinks and PTC heating members made thereof is that such are not suitable for use when the heating element is to be housed in a cylindrical cavity, since the curved sections will be wider after deformation. In addition, the PTC heating members are also required to be assembled to the heating surface of the electrical appliance, which adds to the production procedure, and thus the cost.

It is thus an object of the present invention to provide a heat sink for a PTC heating element, a PTC heating member including such a heat sink, and a method of forming such a heating member, in which the aforesaid shortcomings are mitigated, or at least to provide useful alternatives to the public.

It is also an object of the present invention to provide a method of assembling a PTC heating member to an electrical appliance in which the aforementioned shortcoming is mitigated, or at least to provide a useful alternative to the public.

SUMMARY OF THE INVENTION

According to a first aspect of the present invention, there is provided a heat sink for a PTC heating element, said heat sink including a first end, a second end, and a pair of webs extending from said second end towards said first end, wherein each of said webs is connected to the first end via a respective curved section, and wherein said curved section is inward of the respective web.

According to a second aspect of the present invention, there is provided a PTC heating member including a heat sink fixedly secured with a PTC heating element, wherein said heat sink includes a first end, a second end, and a pair of webs extending from said second end towards said first end, wherein each of said webs is connected to the first end via a curved section, and wherein said curved section is inward of the respective web.

According to a third aspect of the present invention, there is provided a method of forming a PTC heating member, including the steps of (a) providing a heat sink with a first end, a second end, and a pair of webs extending from said second end towards said first end, wherein each of said webs is connected to the first end via a respective curved section, and wherein said curved section is inward of the respective web; (b) providing a PTC heating element in a cavity of said heat sink; and (c) deforming said heat sink to secure said PTC heating element with said heat sink.

According to a fourth aspect of the present invention, there is provided a method of assembling a PTC heating member to a heating surface of an electrical appliance, including the steps of (a) providing a PTC heating member including a heat sink fixedly secured with a PTC pellet; (b) loosely engaging said PTC heating member with said heating surface; and (c) deforming said heat sink or said heating surface to secure said PTC heating member with said heating surface.

According to a fifth aspect of the present invention, there is provided a method of assembling a heat sink and a PTC heating member to a heating surface of an electrical appliance, including the steps of (a) providing a heat sink; (b) providing a PTC pellet in a cavity of said heat sink; (c) loosely engaging said heat sink with said heating surface; and (d) deforming said heat sink or said heating surface to secure said PTC pellet, said heat sink and said heating surface with one another.

According to a sixth aspect of the present invention, there is provided a method of assembling a PTC heating member to a heating surface of an electrical appliance, including the steps of (a) providing a PTC heating member including a heat sink fixedly secured with a PTC pellet; (b) abutting said PTC heating member with a side of said heating surface; and (c) biasing said PTC heating member towards said side of said heating surface.

BRIEF DESCRIPTION OF THE DRAWINGS

Embodiments of the present invention will now be described, by way of examples only, and with reference to the accompanying drawings, in which.

DETAILED DESCRIPTION OF THE PREFERRED EMBODIMENTS

Figure 1A:
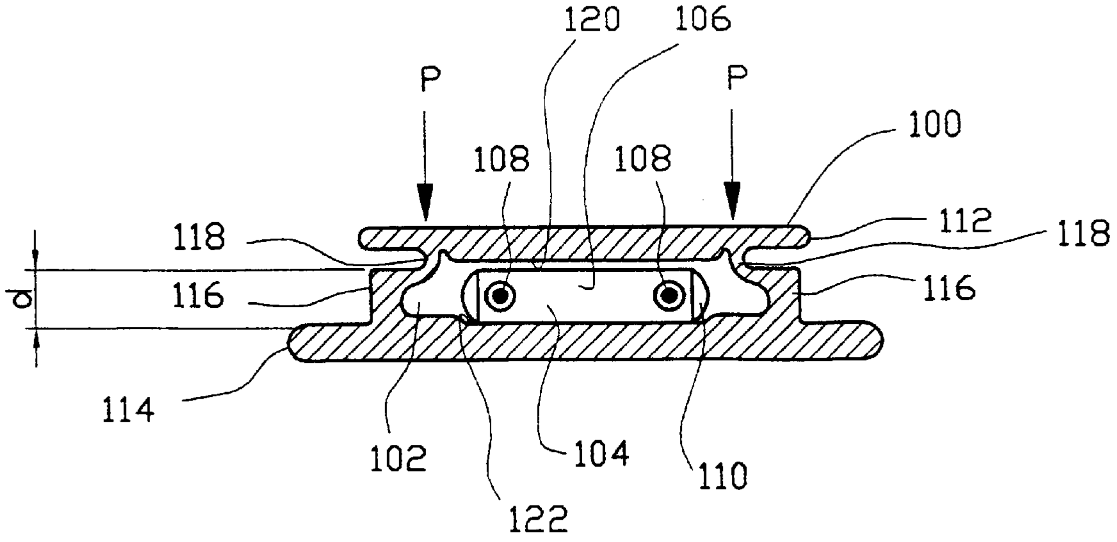
FIG. 1A shows a transverse sectional view of a PTC heating element with a first embodiment of a heat sink according to the present invention before assembly.
Figure 1B:
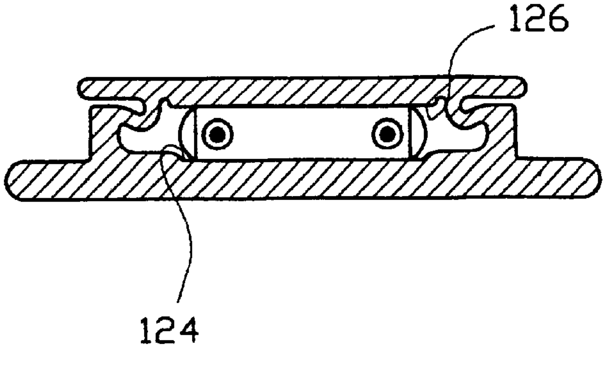
FIG. 1B shows a transverse sectional view of the PTC heating element and the heat sink shown in FIG. 1A after assembly.

Referring firstly to FIGS. 1A and 1B, a first embodiment of a heat sink is shown and generally designated as 100. The heat sink 100 includes a cavity 102 for housing a PTC heater 104. The PTC heater 104 includes a PTC pellet or stone 106 to which two electric wires 108 are connected, each via a plate (not shown) made of an electrically conductive material, e.g. aluminium. The plates are secured to the upper and lower surfaces of the PTC pellet 106 by an adhesive, e.g. a silicone adhesive traded by Toshiba Silicone Co. Ltd., of Japan under Serial No. TSE3261-G. Upon passing of electricity through the electric wires 108, the PTC pellet 106 will generate heat. To electrically insulate the PTC pellet 106 from the heat sink 100, an electrically insulating film 110 is wrapped around the PTC pellet 106. An appropriate film may be a Kapton® polyimide film whether of the HN type or the FN type, from Du Pont Company, of USA.

The heat sink 100 is made of a hollow body extruded section composed of a metal, e.g. aluminium. There is provided an upper end 112 and a lower end 114 which are substantially parallel to each other. Two longitudinal webs 116 extend perpendicularly from the lower end 114 towards the upper end 112. The webs 116 are joined with the upper end 112 by two sections 118. It can be seen that the two sections 118 curve inwardly, and are inward of the two webs 116.

The cavity 102 of the heat sink includes an upper surface 120 and a lower surface 122 which are parallel to each other. The lower surface 122 has a planar recessed portion 124 which is at least as wide as the PTC heater 104. It can be seen that, prior to assembly, and as shown in FIG. 1A, the PTC heater 104 sits within the recessed portion 124. The recessed portion 124 thus assists in positioning the PTC heater 104 generally in the centre of the cavity 102. The height d of the web 116 (see FIG. 1A) is larger than the thickness of the PTC heater 104. There is provided on the upper surface 120 a planar portion 126 which protrudes into the cavity 102 for such a distance that when the heat sink 100 is deformed, the planar portion 126 will contact the PTC heater 104 and secure it to the heat sink 100. Such an arrangement will also assist in avoiding crushing of the PTC heater 104 during deformation of the heat sink 100. Again, the protruding portion 126 is at least as wide as the PTC heater 104.

As shown in FIG. 1A, before assembly, the PTC heater 104 is positioned within the two lateral edges of the protruding portion 126. As the upper surface 120 will experience most of the force during the moulding process, the provision of the protruding portion 126 will increase the thickness, and thus strength, of the upper surface 120, so that undesirable deformation of the upper structure 120 will be avoided.

The PTC heater 104 is securely held in the cavity 102 of the heat sink 100 by deformation of the heat sink 100. In particular, the upper end 112 of the heat sink 100 is pressed towards the lower end 114. To prevent bending of the lateral edges of the upper end 112 of the heat sink 100, the pressing force is applied within the area whose lateral boundaries are marked by the two arrows "P" in FIG. 1A.

The webs 116 remain perpendicular relative to the lower end 114 after pressing. Only the curved sections 118 are deformed, whereby the upper end 112 of the heat sink 100 is brought towards the lower end 114 thereof. It can be seen that, despite the deformation of the curved sections 118, there is no increase in the width of the entire assembly. Such an arrangement allows the manufacture of the heat sinks 100 to fit any predetermined size requirements, without the fear of any unexpected, or unexpected degree of, variation in the width of the resultant PTC heating member.

It can be seen in FIG. 1B that, after assembly, the protruding portion 126 of the upper surface 120 and the lower surface 122 of the cavity 102 of the heat sink 100 are in abutment with the electrically insulating film 100, whereby the PTC heater 104 is securely held in the now deformed cavity 102. This resultant PTC heating member may then be assembled to an electrical appliance, as desired. As the entirety of the resultant PTC heating member will not be accessible or perceivable by the end user of the electrical appliance, the outer surface of the upper end 112 and that of the lower end 114 are of rough surface finishing.

Figure 2A:
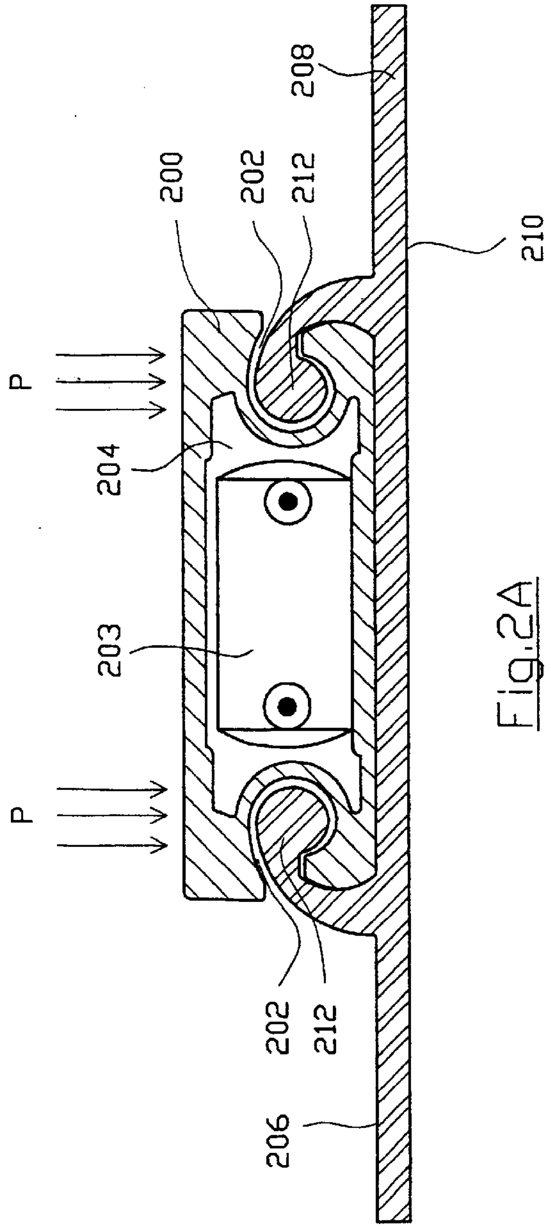
FIG. 2A shows a transverse sectional view of a second embodiment of a heat sink according to the present invention with a PTC heating element and a heating surface of an electrical appliance before assembly.

FIG. 2A shows a second embodiment of a heat sink 200 with two parallel channels 202, each running along a lateral side of the heat sink 200. A PTC heater 203 is placed within a cavity 204 of the heat sink 200. The heat sink is placed in abutment with an inner side 206 of a heating surface 208. An outer side 210 of the heating surface 208 is exposed to the outside environment when the assembly is assembled to an electrical appliance. The outer side 210 may, for example, be one of the flat surfaces for contacting the hair in a hair straightening apparatus or hair styling apparatus. As this outer side 210 is accessible and perceivable by the end user, this side 210 is with fine surface finishing. The heating surface 208 includes two integrally formed extensions 212 which extend longitudinally on the inner side 206 of the heating surface 208 and generally towards each other.

Figure 2B:
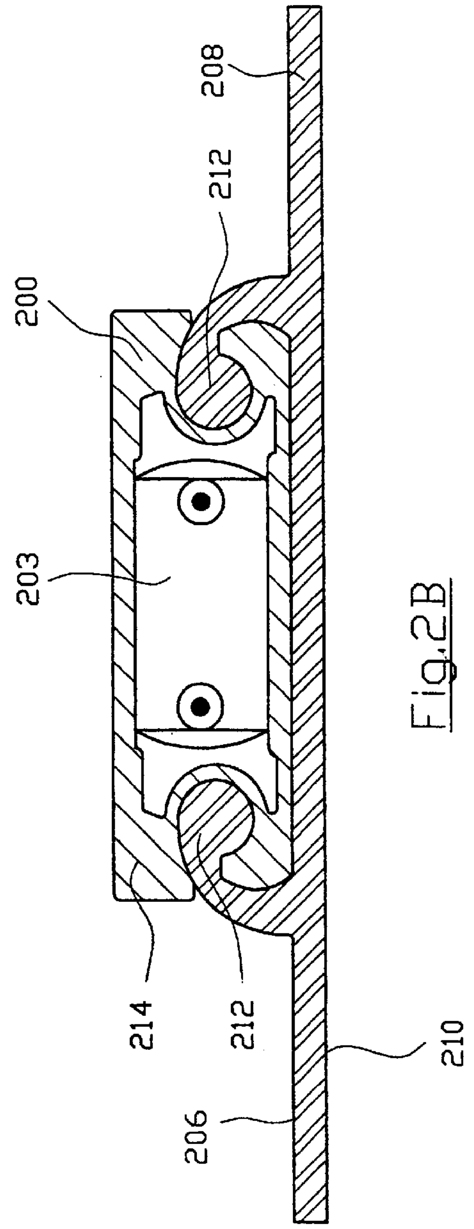
FIG. 2B shows a transverse sectional view of the heat sink, PTC heating element, and heating surface shown in FIG. 2A after assembly.

As can be seen in FIG. 2A, the heat sink 200 is loosely fitted with the heating surface 208, e.g. by having the extensions 212 slidingly received within the channels 202. Pressing force, as denoted by the arrows P, is then applied downwardly onto the heat sink 200 to deform the heat sink 200, in particular the channels 202. By way of such a deformation, the size of the channels 202 are reduced, so as to engage and secure the extensions 212. During the deformation of the heat sink 200, an upper end 214 of the heat sink 200 is also brought down to bear on the PTC heater 203, so that the PTC heater 203 is also secured to the heat sink 200. It can be seen that, by a single pressing action, the heat sink 200, the PTC heater 203 and the heating surface 208 are secured with one another, as shown in FIG. 2B. When so assembled, when the PTC heater 203 generates heat upon passing of electricity, the heat so generated will pass through the heat sink 200 to the heating surface 208.

Figure 3A:
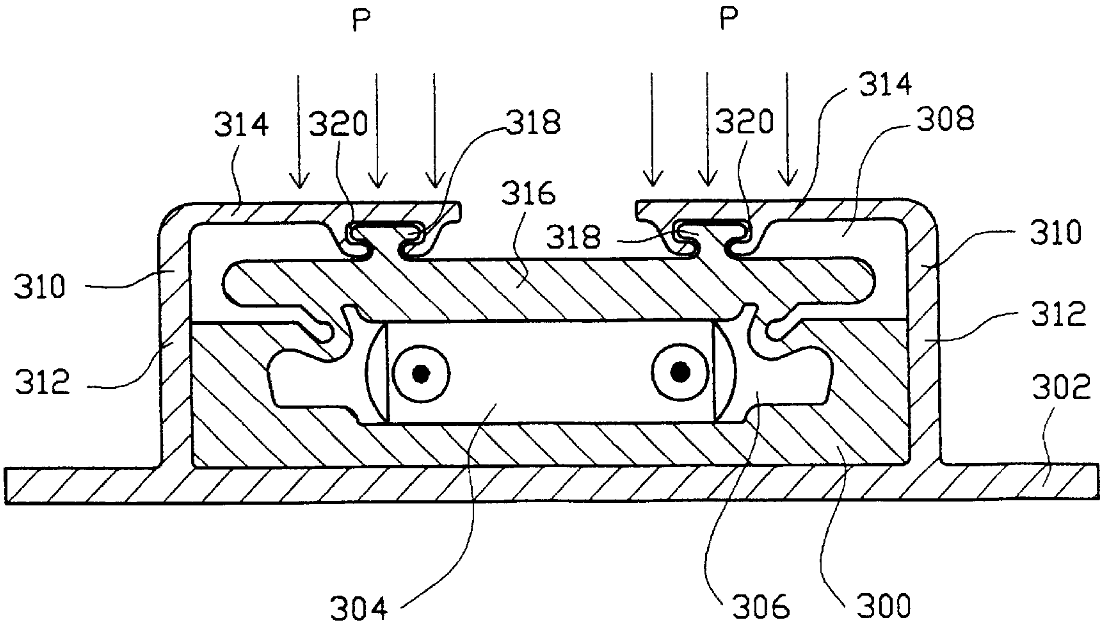
FIG. 3A shows a transverse sectional view of a third embodiment of a heat sink according to the present invention before assembly with a PTC heating element and a heating surface of an electrical appliance.

Turning to FIG. 3A, a third embodiment of a heat sink 300 for assembly with a heating surface 302. The heat sink 300 is secured with a PTC heater 304 within a cavity 306. The PTC heater 304 is received within a top-open cavity 308 formed between two longitudinal extensions 310 which are integrally formed with the heating surface 302. Each of the two extensions 310 includes a first part 312 which extends perpendicularly away from the heating surface 302, and a second part 314 which extends inwardly towards each other. The parts 312 and 314 are formed integrally with each other.

Figure 3B:
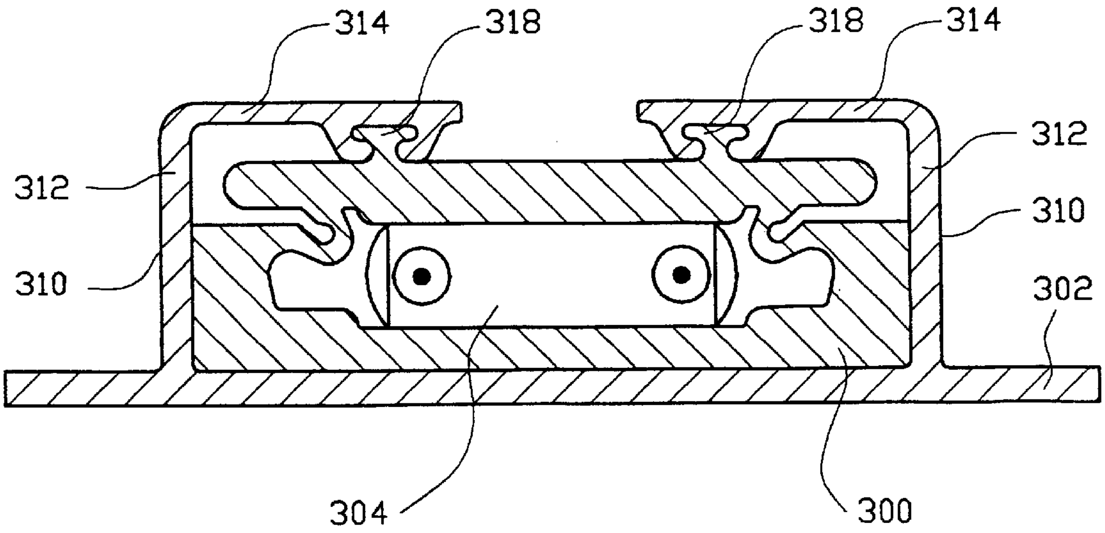
FIG. 3B shows a transverse sectional view of the PTC heating element, heat sink and heating surface shown in FIG. 3A after assembly.

Provided on an upper end 316 of the heat sink 300 are two longitudinal ridges 318 which run parallel to each other. The ridges 318 are received within two longitudinal and parallel channels 320, each provided under one of the parts 314, so as to loosely engage the heat sink 300 with the heating surface 302. Downward force, as denoted by arrows P in FIG. 3A, is applied on the parts 314 to deform the channels 320. In particular, the size of the channels 320 is reduced so as to secure the ridges 318 of the heat sink 300, as shown in FIG. 3B.

Figure 4A:
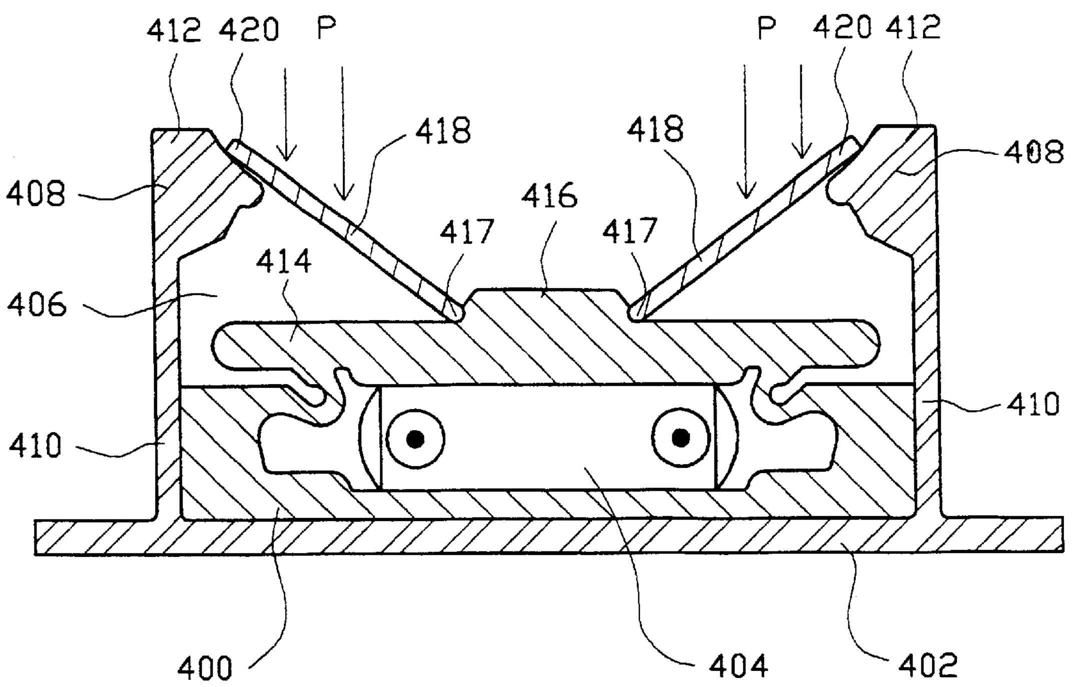
FIG. 4A shows a transverse sectional view of a fourth embodiment of a heat sink according to the present invention before assembly with a heating surface of an electrical appliance.

A fourth embodiment of a heat sink 400 is shown in FIG. 4A, for being assembled with a heating surface 402. The heat sink 400 is secured with a PTC heater 404. The heat sink 400 is placed within a cavity 406 formed between two longitudinal extensions 408 which extend perpendicularly from the heating surface 402. The extensions 408 are integrally formed with the heating surface 402. Each of the extensions 408 includes a thinner base portion 410 and a broader head portion 412. On an upper end 414 of the heat sink 400 is provided with a protruding portion 416. Lower ends 417 of two resilient rods or plates 418 are placed against the protruding portion 416, while upper ends 420 are placed on the head portions 412.

Figure 4B:
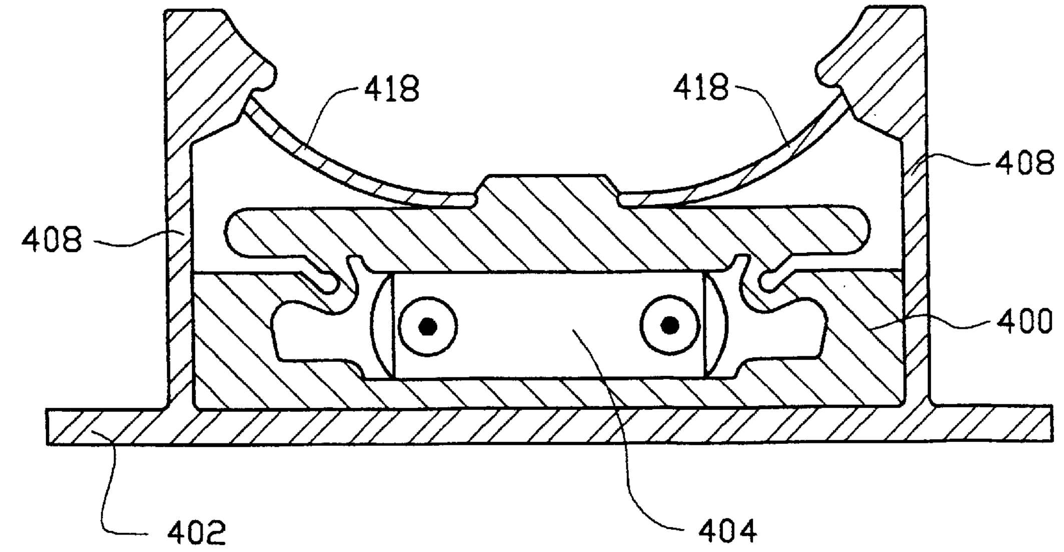
FIG. 4B shows a transverse sectional view of the heat sink and heating surface shown in FIG. 4A after assembly.

When downward force, as denoted by arrows P in FIG. 4A, is applied on the resilient rods or plates 418, the rods or plates 418 are forced to move to the positions as shown in FIG. 4B. In this position, the rods or plates 418 act as springs and exert a downward force on the heat sink 400 to bias the heat sink 400 towards the heating surface 402.

Figure 5A:
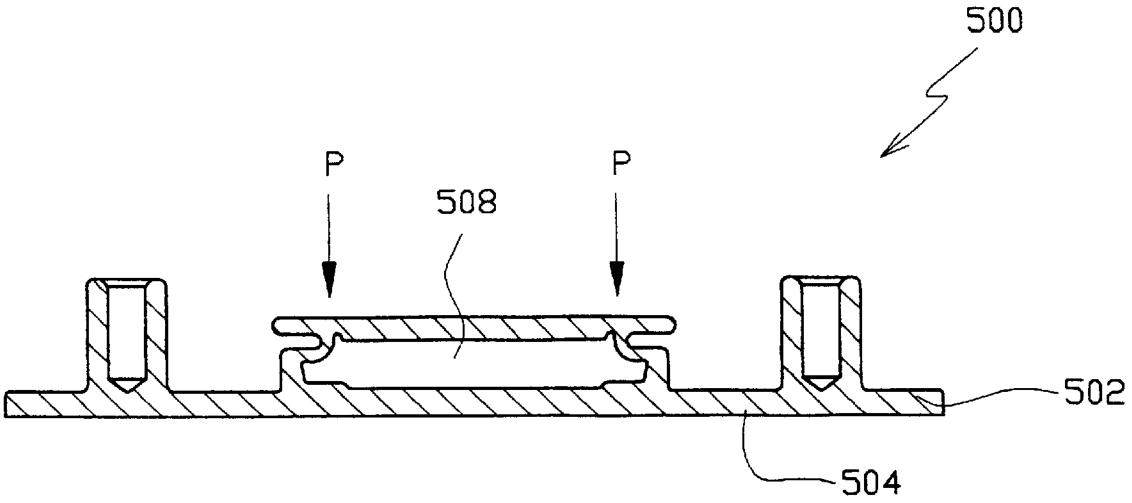
FIG. 5A shows a transverse sectional view of a fifth embodiment of a heat sink according to the present invention.

FIG. 5A shows a second embodiment of an integrally formed heat sink generally designated as 500. The main difference between this heat sink 200 and the heat sink 100 discussed above is that the heat sink 500 includes a lower end 502 whose outer surface 504 is or is adapted to be exposed to the outside environment when assembled to an electrical appliance. The outer surface 504 may, for example, be one of the flat surfaces for contacting the hair in a hair straightening apparatus or hair styling apparatus.

Figure 5B:
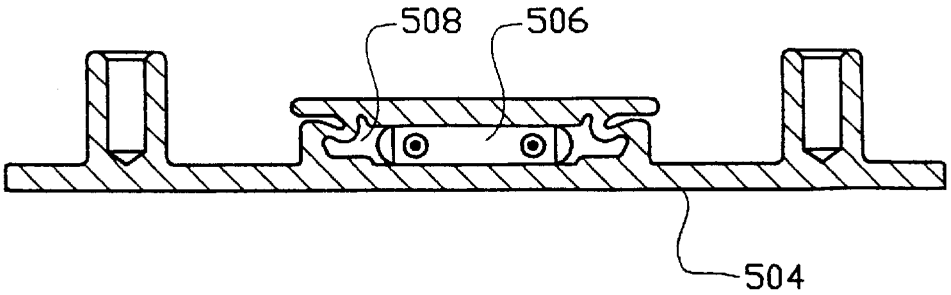
FIG. 5B shows a transverse sectional view of the heat sink shown in FIG. 5A assembled with a PTC heating element.

As shown in FIG. 5B, a PTC heater 506 is securely held within a cavity 508 in the heat sink 500, so that the heat generated by the PTC heater 506 is transferred directly to the outer heating surface 504 without any further intermediary. As the outer surface 504 will be exposed to the outside environment when assembled to an electrical appliance, and thus accessible and perceivable by the end user, this surface 504 is with fine surface finishing.

Figure 6A:
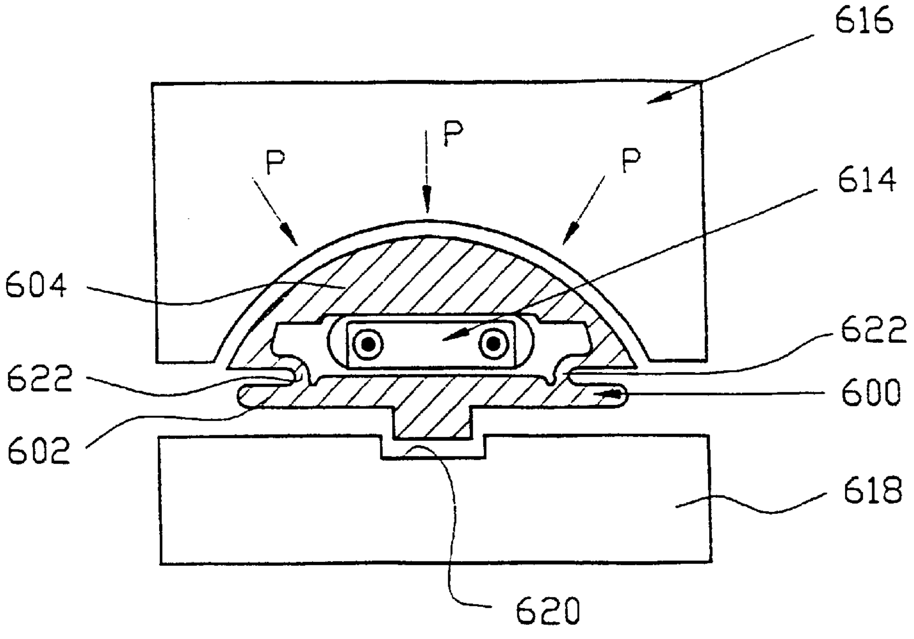
FIG. 6A shows a transverse sectional view of a PTC heating element with a sixth embodiment of a heat sink according to the present invention before assembly.

Sometimes a PTC heating member is required to be affixed to a curved, e.g. cylindrical, inner cavity of a heating surface of an electrical appliance. A sixth embodiment of a heat sink which is appropriate for use in such a situation is shown in FIG. 6A and indicated as 600. The heat sink 600 includes a first end 602 and a second end 604. The first end 602 has a generally planar outer surface 606 with a central longitudinal raised ridge 608 running thereon.

The second end 604 of the heat sink 600 has a curved outer surface 610, whose radius of curvature corresponds to that of the curved inner cavity of the heating surface of the electrical appliance. The heat sink 600 includes a cavity 612 for housing a PTC heater 614. When assembling, the heat sink 600 with the PTC heater 614 disposed in the cavity 612 is positioned between an upper mould 616 and a lower mould 618. It can be seen in FIG. 6A that the surface of the upper mould 618 facing the heat sink 600 is correspondingly curved as the outer surface 610 of the second end 604 of the heat sink 600, while the surface of the lower mould 618 facing the heat sink 600 includes a recessed portion 620 which corresponds to the size and shape of the raised ridge 606 of the outer surface of the first end of the heat sink 600.

Figure 6B:
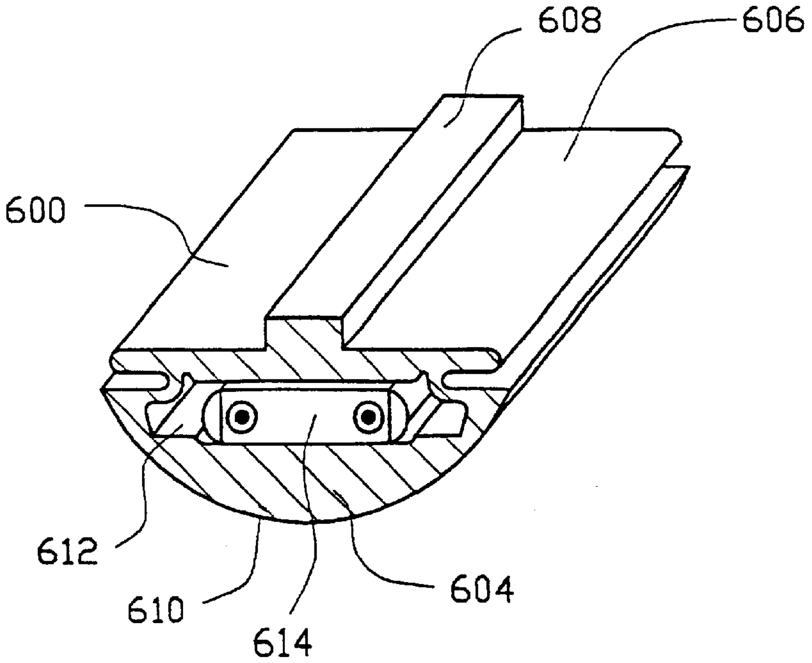
FIG. 6B shows a perspective view of the PTC heating element and heat sink shown in FIG. 6A after assembly.

The upper mould 616 presses towards the heat sink 600 against the backing of the lower mould 618. The pressing force from the upper mould, as indicated by the arrows P in FIG. 6A, deforms the heat sink 600, in particular inwardly curved sections 622 joining the first end 602 and the second end 604, and thereby to securely hold the PTC heater 614 within the cavity 612 of the heat sink 600, as shown in FIG. 6B.

Figure 6E:
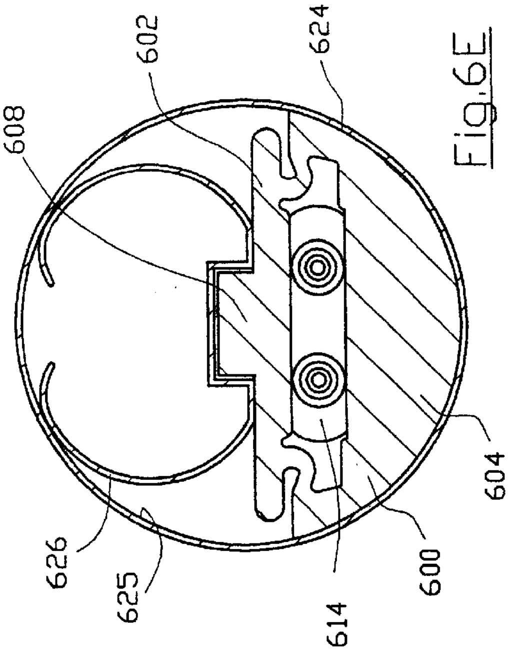
FIG. 6E is a transverse sectional view of the assembly shown in FIG. 6C.
Figure 6C:
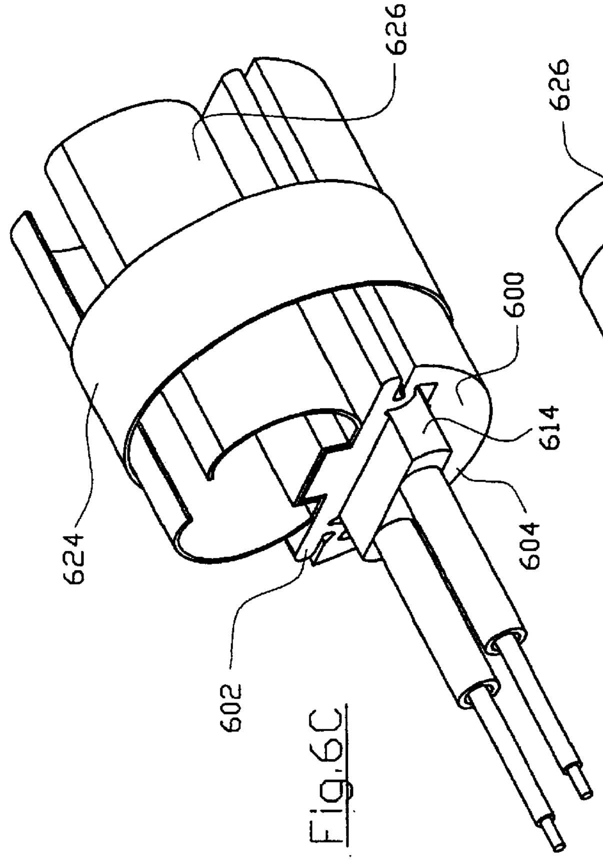
FIG. 6C is a front perspective view showing a PTC heating member including a heat sink as shown in FIG. 6A as assembled with a heating surface by a first type of spring.
Figure 6D:
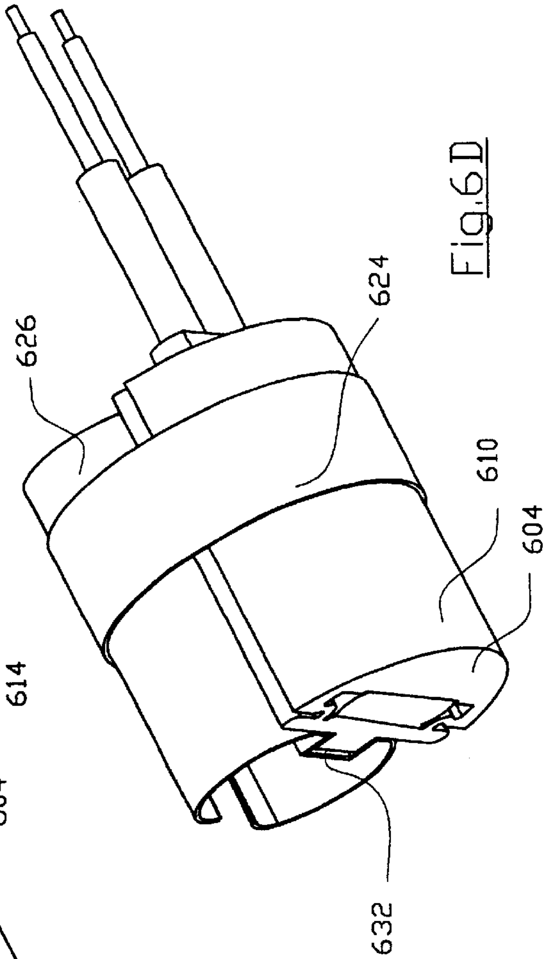
FIG. 6D is a rear perspective view of the assembly shown in FIG. 6C.

FIGS. 6C to 6E show the heat sink 600 with the PTC heater 614 secured thereto, as assembled to an inner cavity of a heat transferring barrel 624 of an electrical appliance, e.g. a hair curler. It can be seen that the curved outer surface 610 of the second end 604 of the heat sink 600 is in contact with an inner curved surface 625 of the barrel 624. The heat sink 600 and the PTC heater 614 are retained in this position by a spring plate 626.

The spring plate 626 is made of a thin elastic metallic plate, and includes two wings 628 which abut the curved inner surface 625 of the barrel 624. The spring plate 626 also includes a recessed portion 630 which corresponds to the size and shape of the raised ridge 606 of the outer surface of the first end 602 of the heat sink 600. The recessed portion 630 of the spring plate 626 is thus engaged with the raised ridge 606 to bias the heat sink 600 towards its second end 604, so as to secure the heat sink 600, and thus the PTC heater 614, within the barrel 624.

Figure 6F:
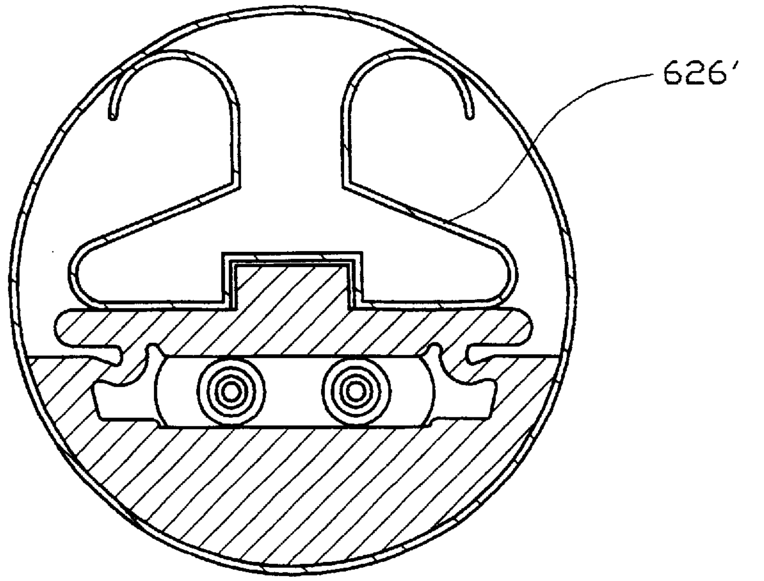
FIG. 6F is a transverse sectional view showing the use of a second type of spring in an assembly of a PTC heating member including a heat sink as shown in FIG. 6A with a heating surface of an electrical appliance.
Figure 6G:
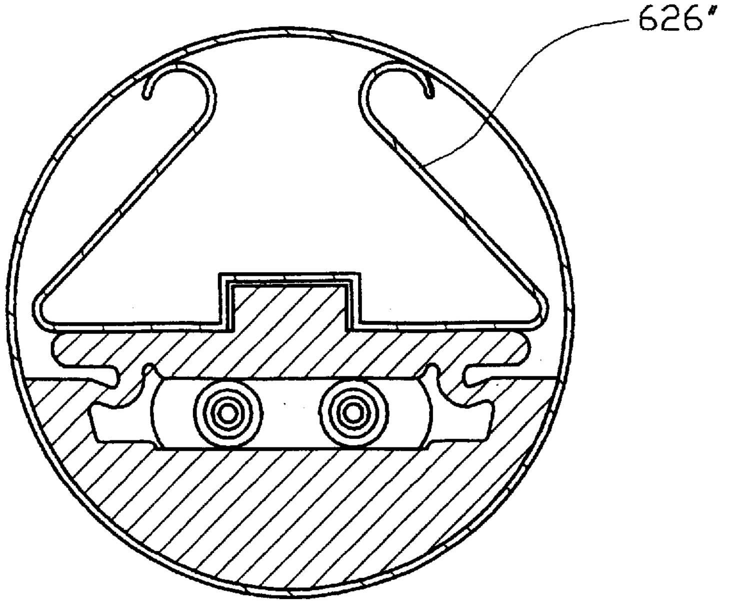
FIG. 6G is a transverse sectional view showing the use of a third type of spring in an assembly of a PTC heating member including a heat sink as shown in FIG. 6A with a heating surface of an electrical appliance.

To limit the axial movement of the heat sink 600 relative to the barrel 624, a stopper 632 is integrally formed with the spring plate 626 at one end thereof, which assists in preventing movement of the heat sink relative to the barrel 624 in the axial direction. Spring plates of other shapes may also be used in retaining the heat sink 600 within the barrel 624. Spring plates of other shapes which may be used in the present invention are shown in FIGS. 6F and 6G and designated as 626' and 626" respectively.

Figure 7A:
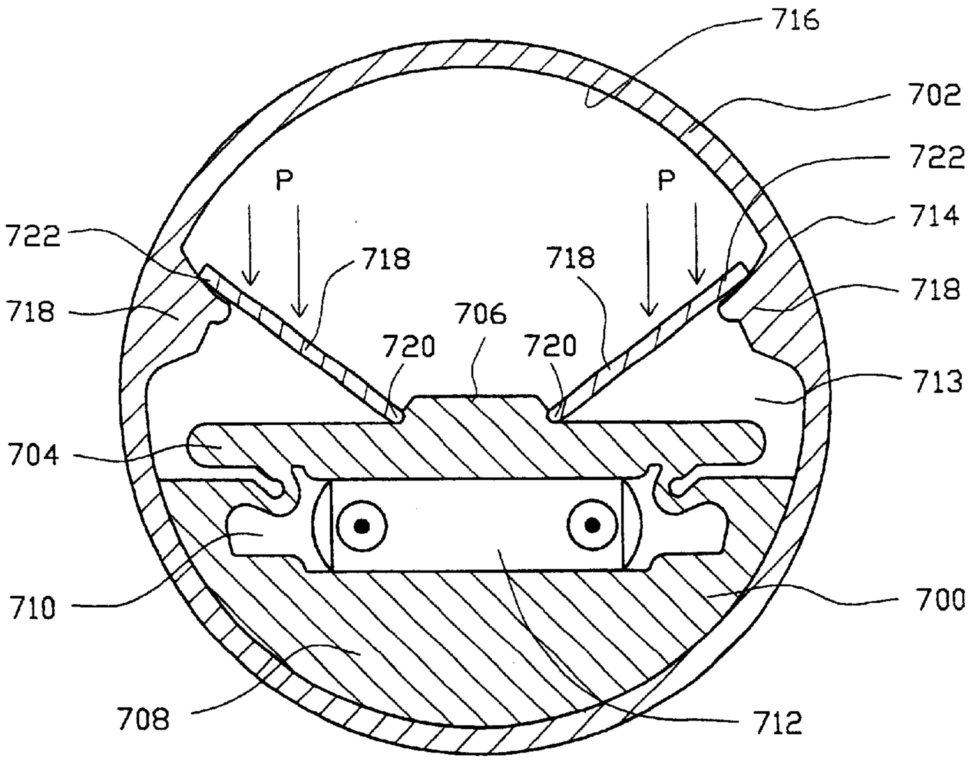
FIG. 7A shows a transverse sectional view of a seventh embodiment of a heat sink according to the present invention before assembly with a heating surface of an electrical appliance.

FIG. 7A shows a seventh embodiment of a heat sink 700 engaged with a heating surface 702 of an electrical appliance (not shown). As can be seen, the heat sink 700 is similar to the heat sink 600 discussed above. In particular, the heat sink 700 includes a first end 704 with a raised central longitudinal ridge 706. A second end 708 of the heat sink 700 is curved, e.g. in the form of an arc of an circle, i.e. with a constant radius of curvature. Secured within a cavity 710 of the heat sink 700 is a PTC heater 712.

The heating surface 702 of the electrical appliance is in the general shape of a cylinder with an interior cavity 713. As its outer surface 714 is intended to be exposed to the outside environment, and thus accessible and perceivable by a user, when such is assembled to the electrical appliance, the outer surface 714 is with fine surface finishing. The interior surface 716 of the heating surface is also generally circular, but with two protrusions 718 extending into the interior cavity 713. The second end 708 of the heat sink 700 is sized to be received within the interior cavity 713 of the heat sink 700, and to abut the interior surface 716 thereof. A pair of resilient rods or plates 718 are positioned in the cavity 713 with their respective lower ends 720 abutting a recess between the ridge 706 and the first end 704. A respective upper end 722 of the resilient rods or plates 718 lie on top of one of the protrusions 718.

Figure 7B:
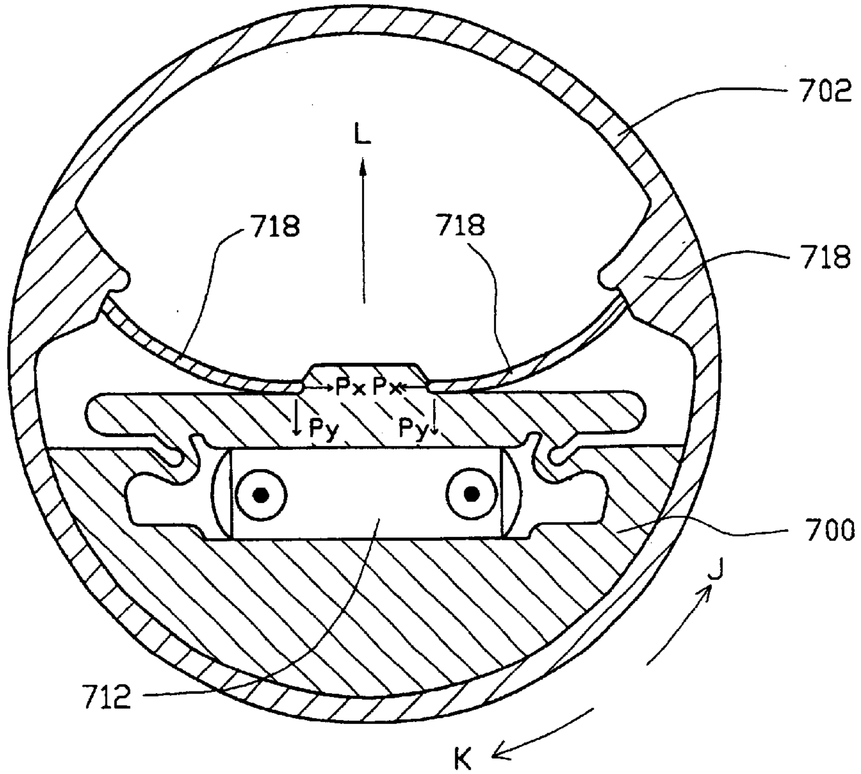
FIG. 7B shows a transverse sectional view of the PTC heating element and heating surface shown in FIG. 7A after assembly.

When force is applied onto the resilient rods or plates 718, as denoted by the arrows P in FIG. 7A, the resilient rods or plates 718, because of their resilience, will proceed, in a snap-fit manner, to assume the positions as shown in FIG. 7B. In this position, each of the two rods or plates 718 will exert a horizontal force $P_x$ on the heat sink 700. The forces $P_x$ are equal in magnitude but opposite to each other. While the two forces $P_x$ cancel out each other, they serve to retain the heat sink 700 in its position, against any swiveling movement thereof relative to the heating surface 702, e.g. in the direction of the arrows J or K shown in FIG. 7B.

In addition, each of the rods or plates 718 also exerts a downward force $P_y$, which forces combine to bias the heat sink 700 downwardly, and against any movement of the heat sink 700 relative to the heating surface 702 in the direction indicated by the arrow L in FIG. 7B.

Figure 8A:
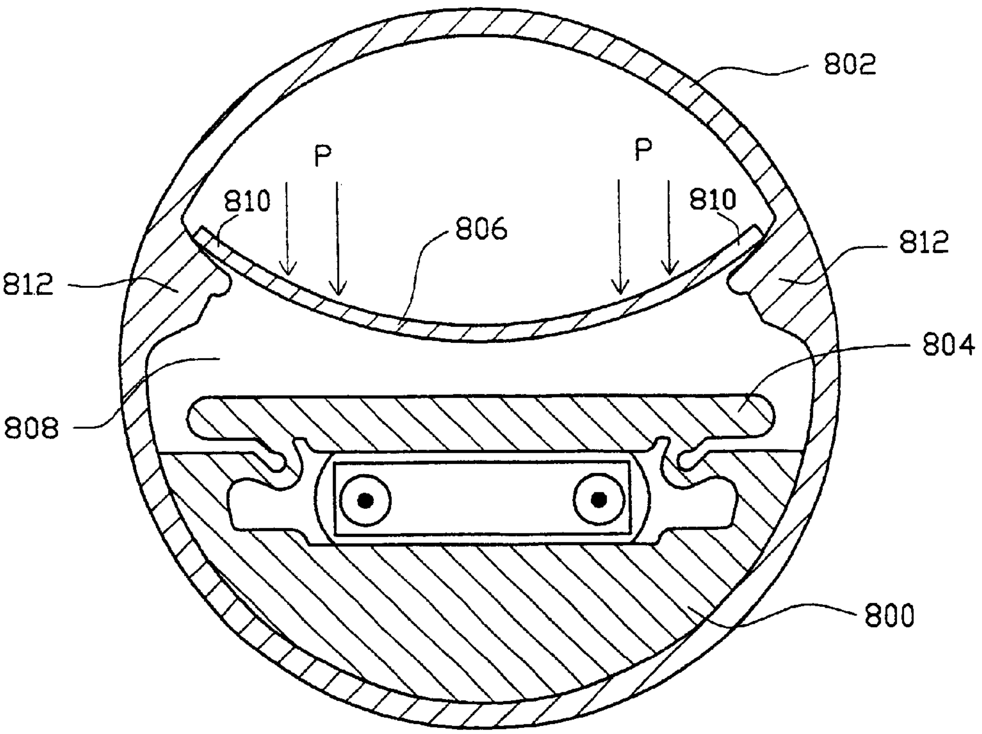
FIG. 8A shows a transverse sectional view of an eighth embodiment of a heat sink according to the present invention before assembly with a heating surface of an electrical appliance.

An alternative embodiment of a heat sink according to the present invention is shown in FIG. 8A and indicated as 800. This heat sink is also adapted to be assembled to a heating surface 802 which is essentially the same as the heating surface 702 discussed above. The heat sink 800 is also generally similar to the heat sink 700 discussed above, except that the heat sink 800 does not include a raised central longitudinal ridge on its upper end 804. The upper end 804 is thus planar. A resilient rod or plate 806 is positioned within an interior cavity 808, with its two ends 810 each lying on a protrusion 812 of the heating surface 802.

Figure 8B:
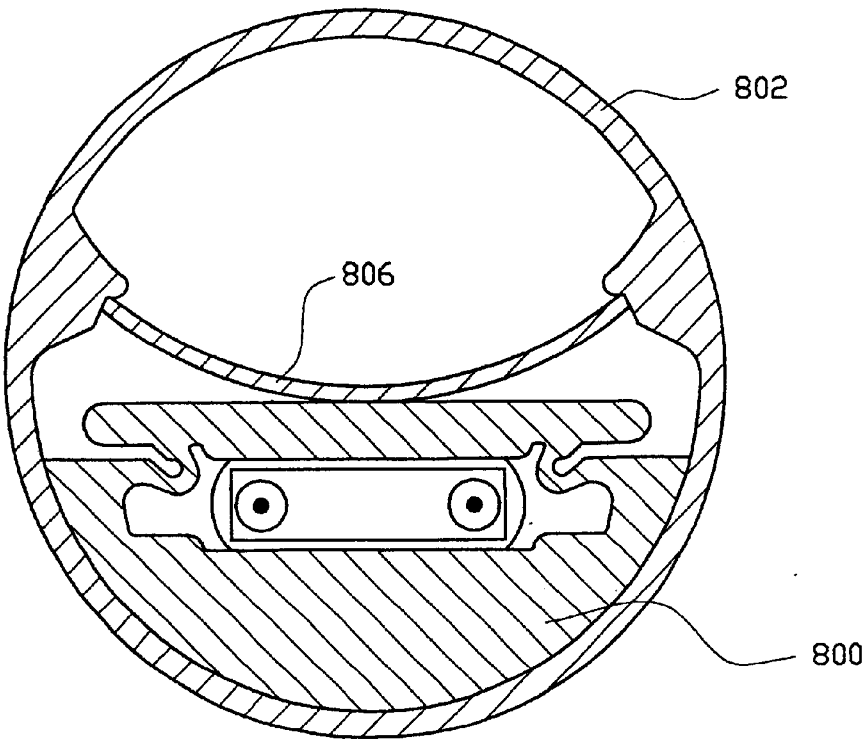
FIG. 8B shows a transverse sectional view of the PTC heating element and heating surface shown in FIG. 8A after assembly.

As in the previous embodiment, when force is applied downwardly, as denoted by the arrows P in FIG. 8A, the resilient rod or plate 806, due to its resilience, proceeds, in a snap-fit manner, to the position shown in FIG. 8B, in which its serves to retain the heat sink 800 its is position.

Figure 9A:
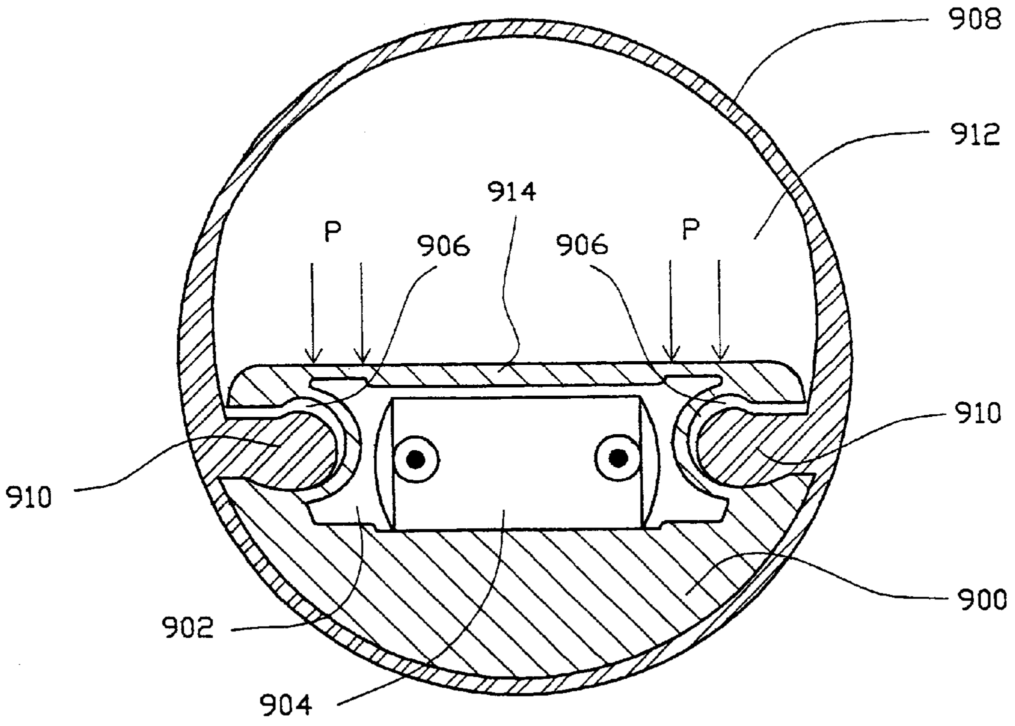
FIG. 9A shows a transverse sectional view of a ninth embodiment of a heat sink according to the present invention before assembly with a heating surface of an electrical appliance.

A ninth embodiment of a heat sink 900 is shown in FIG. 9A. Placed within a cavity 902 of the heat sink 900 is a PTC heater 904. On two lateral sides of the heat sink 900 are provided with a pair of parallel longitudinal channels 906. The heat sink 900 is shown in FIG. 9A as being loosely fitted with a hollow cylindrical heating surface 908. In particular, the heating surface 908 includes two extensions 910 which extend into an interior cavity 912 of the heating surface 908. The extensions 910 are slidingly received the channels 906 of the heat sink 900, to assume the position shown in FIG. 9A.

Figure 9B:
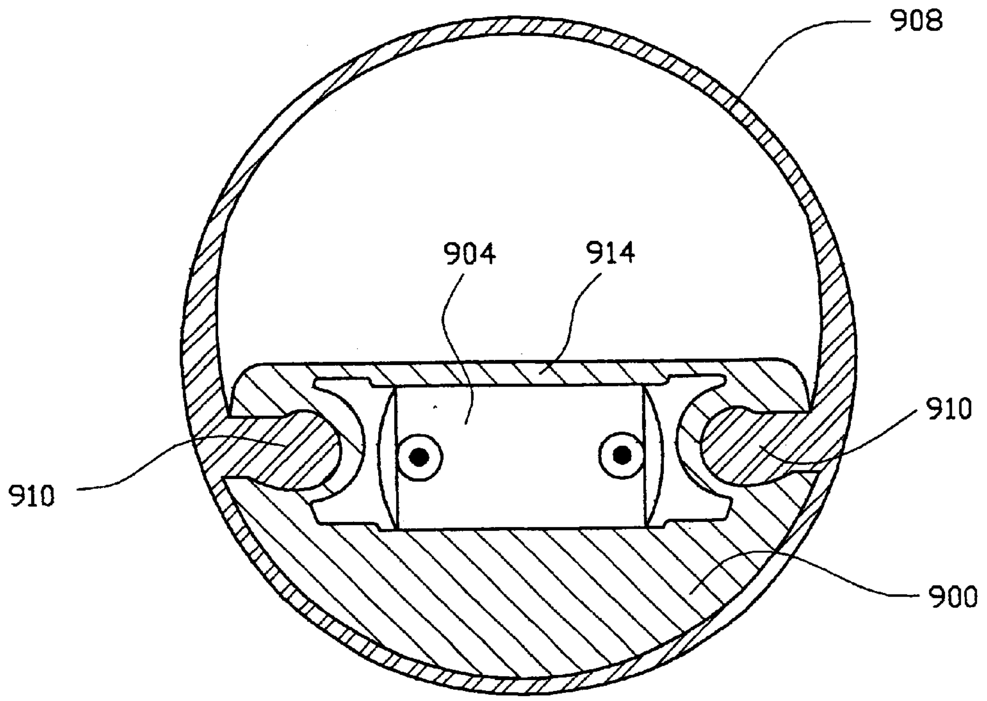
FIG. 9B shows a transverse sectional view of the PTC heating element and heating surface shown in FIG. 9A after assembly.

When downward force, as denoted by the arrows P in FIG. 9A, the heat sink 900, in particular the channels 906 thereof, are deformed. Upon such deformation, the size of the channels 906 are reduced to fixedly secure the extensions 910 of the heating surface 908. By way of the same deformation, an upper end 914 of the heat sink 900 is brought down to bear on the PTC heater 904, so as to secure the PTC heater 904 to the heat sink 900, as shown in FIG. 9B. It can thus be seen that the PTC heater 904, the heat sink 900 and the heating surface 908 are secured with one another in a single pressing action.

Figure 10A:
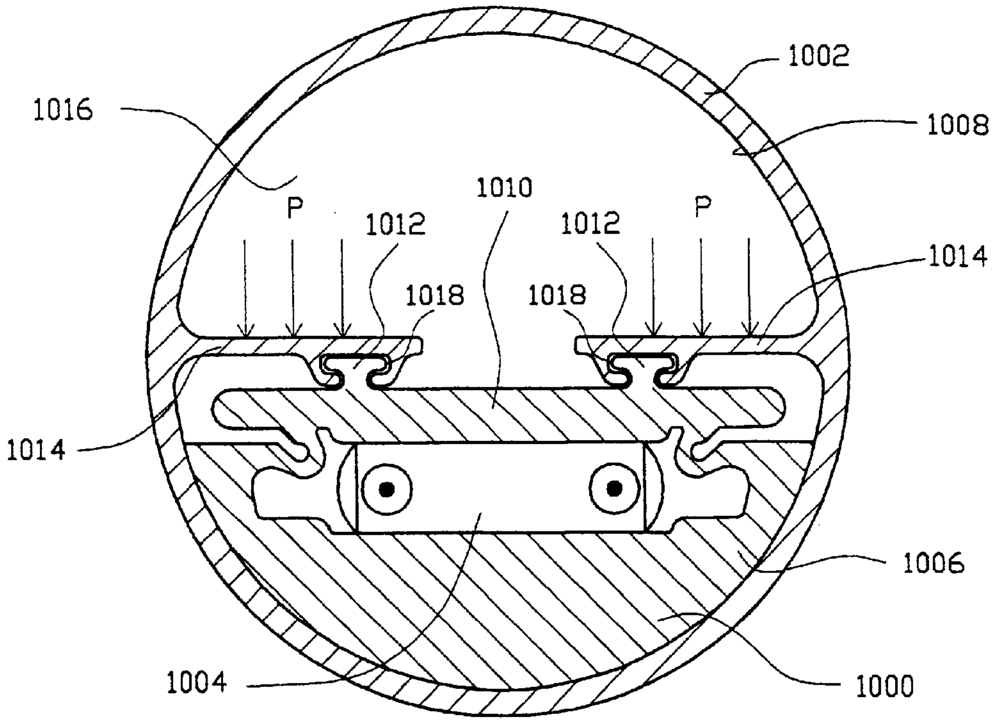
FIG. 10A shows a transverse sectional view of a tenth embodiment of a heat sink according to the present invention before assembly with a heating surface of an electrical appliance.
Figure 10B:
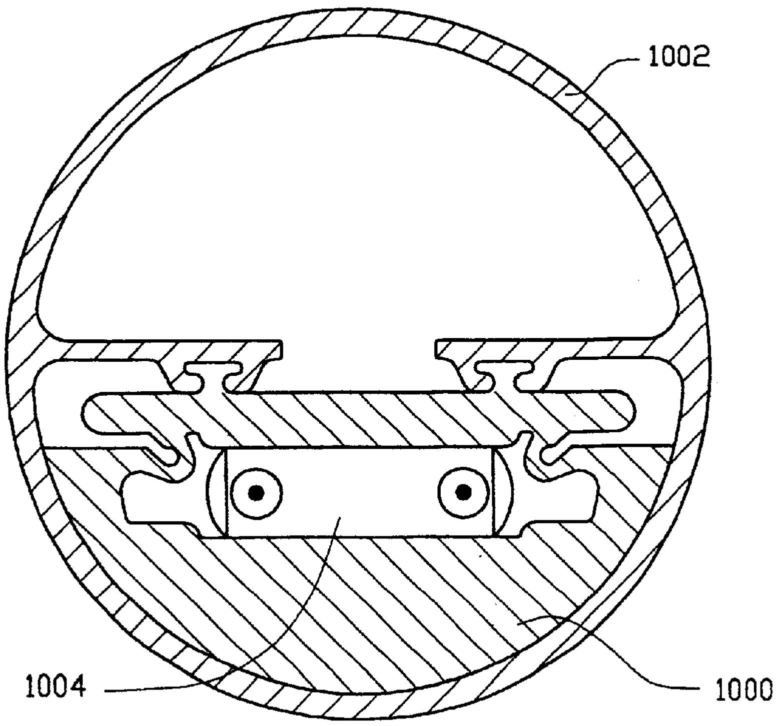
FIG. 10B shows a transverse sectional view of the PTC heating element and heating surface shown in FIG. 10A after assembly.

Turning to FIG. 10A, a tenth embodiment of a heat sink 1000 is shown as loosely engaged with a hollow cylindrical heating surface 1002. The heat sink 1000 is provided with a PTC heater 1004. The heat sink 1000 includes a curved first end 1006 which abuts an inner surface 1008 of the heating surface 1002. The outer surface of the first end 1006 of the heat sink 1000 is in the form of an arc of a circle, i.e. of a constant radius of curvature, which corresponds to the inner curvature of the heating surface 1002. A second end 1010 of the heat sink 1000 includes two longitudinal parallel ridges 1012.

As to the heating surface 1002, such includes two extensions 1014 which extend into an interior surface 1016 of the heating surface 1002. Each of the extensions 1014 includes a channel 1018 for receiving one of the ridges 1012. In this position, the heat sink 1000 is loosely engaged with the heating surface 1002. Downward force, as denoted by the arrows P shown in FIG. 10A, is applied onto the extensions 1014 of the heating surface 1002 to deform the channels 1018 of the extensions 1014. In this way, the size of the channels 1018 is reduced so as to grip and secure the ridges 1012 of the heat sink 1000. The heat sink 1000, and thus the PTC heater 1004 carried by it, are secured to the heating surface 1002.

Figure 11C:
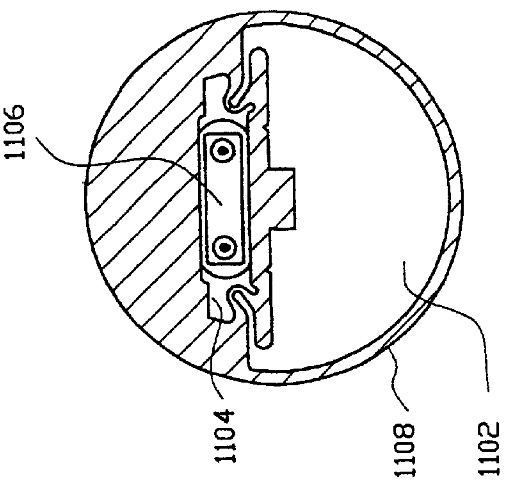
FIGS. 11A to 11C are transverse sectional views showing the securing of a PTC heating element with an eleventh embodiment of a heat sink according to the present invention.
Figure 11B:
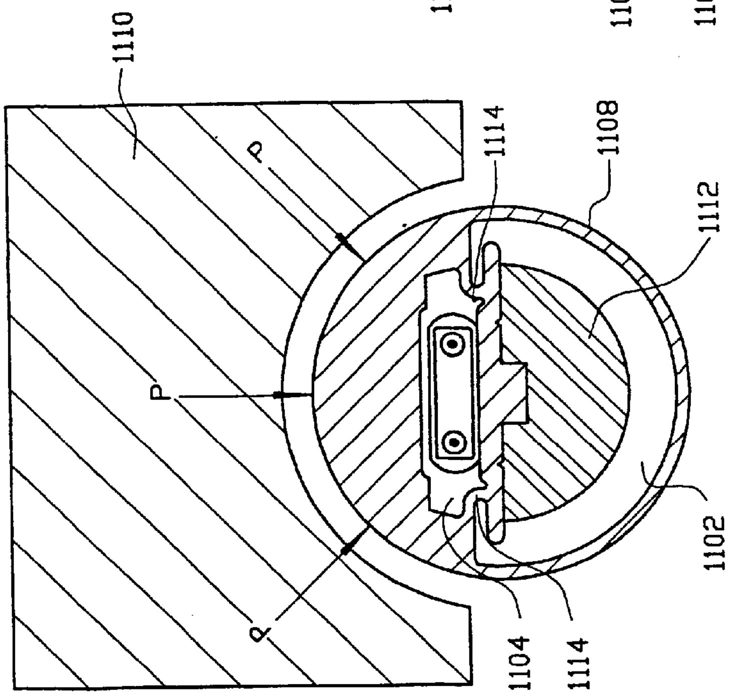
Figure 11A:
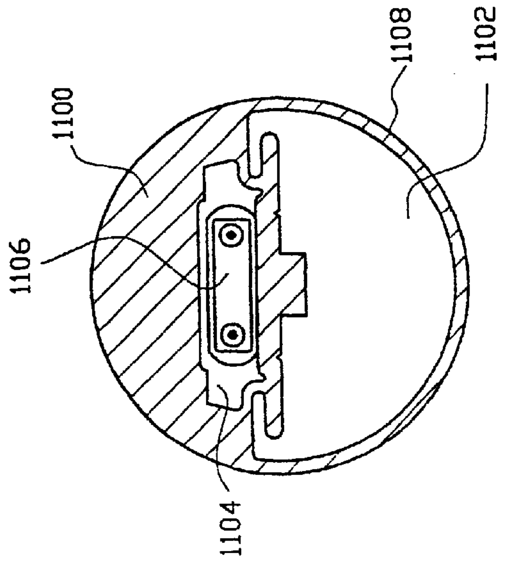

An eleventh embodiment of a heat sink according to the present invention is shown in FIG. 11A, and generally designated as 1100. The heat sink 1100 includes a larger cavity 1102 and a smaller cavity 1104. A PTC heater 1106 is placed within the smaller cavity 1104. It can be seen that the entire outer surface 1108 of the heat sink 1100 is curved, and the heat sink 1100 is generally in the form of a cylinder.

For securing the PTC heater 1106 to the heat sink 1100, there is provided an upper mould 1110 and a lower mould 1112. In particular, the lower mould 1112 is inserted into the larger cavity 1102 of the heat sink 1100. The upper mould 1110 is then pressed towards the lower mould 1112, whereby the pressing force, as represented by the arrows P in FIG. 11B, deforms the heat sink 1100. In particular, inwardly curved sections 1114 are deformed after pressing so that the PTC heater 1106 is securely held in the smaller cavity 1104, as shown in FIG. 11C. The heat sink 1100 together with the PTC heater 1106 held therein can be used as part of the final electrical appliance, in which the outer surface 1108, which has fine surface finishing, is exposed to the outside environment.

It should be understood that the above only illustrates embodiments whereby the present invention may be carried out, and that further modifications and/or alterations may be made thereto without departing from the spirit of this invention.

It should also be understood that certain features of the invention, which are, for clarity, described in the context of separate embodiments, may also be provided in combination in a single embodiment. Conversely, various features of the invention which are, for brevity, described in the context of a single embodiment, may also be provided or separately or in any suitable subcombination.

What is claimed is:

1. A heat sink for a PTC heating element, said heat sink including a first end, a second end, a pair of webs extending from said second end toward said first end, and a pair of curved sections, wherein each of said webs is connected to the first end via the respective curved section, and wherein said curved section is inward of the respective web and extends into a cavity defined by said first end, said second end, and said pair of webs.

2. A heat sink according to claim 1, wherein the heat sink is adapted to engage a PTC heating element in the cavity by deformation of at least a portion of the heat sink against the PTC heating element, and wherein said webs extend substantially perpendicularly from said second end before and after said deformation of said heat sink.

3. A heat sink according to claim 1, wherein each curved section is deformable to engage a surface of the heat sink with a heating surface of an electrical appliance.

4. A heat sink according to claim 3 wherein said heat sink includes at least one channel member or one ridge member adapted to be engaged with a heating surface of an electrical appliance.

5. A heat sink according to claim 3 wherein said heat sink includes a pair of channel members or a pair of ridge members.

6. A heat sink according to claim 5 wherein said channel members or said ridge members are substantially parallel to each other.

7. A heat sink according to claim 1 wherein said first end includes a ridge member.

8. A heat sink according to claim 7 wherein said ridge member of said first end extends in the longitudinal direction.

9. A heat sink according to claim 1 wherein said second end includes an outer surface adapted to be exposed to the outside environment when said heat sink is assembled to an electrical appliance.

10. A heat sink according to claim 9 wherein said outer surface of said second end is substantially planar.

11. A heat sink according to claim 10 wherein said outer surface of said second end is curved.

12. A heat sink according to claim 9 wherein said heat sink is generally cylindrical in shape.

13. A heat sink according to claim 1 wherein said second end includes a curved outer surface.

14. A heat sink according to claim 1 wherein said heat sink includes a cavity for receiving a PTC heating element, which cavity including two oppositely-facing surfaces adapted to contact said PTC heating element, and wherein at least one of said surfaces includes a portion protruding into said cavity.

15. A heat sink according to claim 4 wherein said protruding portion includes a substantially planar surface.

16. A heat sink for a PTC heating element as in claim 1, wherein the first end, the second end, the pair of webs, and the pair of curved sections are integral parts of the heat sink.

17. A heat sink for a PTC heating element as in claim 16, wherein the heat sink is adapted to engage a PTC heating element within the cavity.

18. A heat sink as in claim 16, wherein the cavity has two oppositely facing surfaces adapted to receive a PTC heating element, and wherein at least one of the surfaces includes a portion protruding into the cavity, said protruding portion including a substantially planar portion.

19. A heat sink as in claim 16, wherein the cavity has two oppositely facing surfaces adapted to receive a PTC heating element, and wherein at least one of the surfaces includes a recessed portion adapted for receiving a PTC heating element.

20. A heat sink for a PTC heating element as in claim 1, wherein the heat sink is an extruded section.

21. A heat sink for a PTC heating element as in claim 1, wherein the curved sections are deformable under a compressive load applied to the first or second end to engage the PTC heating element.

22. A heat sink for a PTC heating element as in claim 21, wherein each web extends substantially perpendicular from said second end both before and after deformation of the curved sections.

23. A PTC heating member including a heat sink fixedly secured with a PTC heating element, wherein said heat sink includes a first end, a second end, a pair of webs extending from said second end towards said first end, and a pair of curved sections, wherein each of said webs is connected to the first end via one of the pair of curved sections, and wherein each of the pair of said curved sections is inward of the respective web, and extends into a cavity defined by said first end, said second end, and said pair of webs.

24. A PTC heating member according to claim 23 wherein the height of said webs is larger than the thickness of said PTC heating element.

* * * * *

UNITED STATES PATENT AND TRADEMARK OFFICE

CERTIFICATE OF CORRECTION

PATENT NO. : 6,455,822 B1
DATED : September 24, 2002
INVENTOR(S) : Kee Hung Daniel Chang It is certified that error appears in the above-identified patent and that said Letters Patent is hereby corrected as shown below:

Title page,
Item [73], correct Assignee to read -- Mega Dynamic Ltd., Hong Kong --.

Signed and Sealed this

Twentieth Day of May, 2003

JAMES E. ROGAN
*Director of the United States Patent and Trademark Office*